United States Patent
Tsuchiya et al.

(10) Patent No.: US 6,930,037 B2
(45) Date of Patent: Aug. 16, 2005

(54) PROCESS FOR FORMING A METAL INTERCONNECT

(75) Inventors: Yasuaki Tsuchiya, Tokyo (JP); Tomoko Wake, Tokyo (JP)

(73) Assignee: NEC Electronics Corporation, Tokyo (JP)

( * ) Notice: Subject to any disclaimer, the term of this patent is extended or adjusted under 35 U.S.C. 154(b) by 0 days.

(21) Appl. No.: 09/737,397

(22) Filed: Dec. 15, 2000

(65) Prior Publication Data

US 2001/0006841 A1 Jul. 5, 2001

(30) Foreign Application Priority Data

Dec. 28, 1999 (JP) .......................................... 11-374487

(51) Int. Cl.$^7$ ......................................... H01L 21/4763
(52) U.S. Cl. ....................... 438/631; 438/645; 438/691; 438/692; 438/693; 438/959
(58) Field of Search ................................. 438/631, 645, 438/691, 692, 693, 959, FOR 119

(56) References Cited

U.S. PATENT DOCUMENTS

| | | | |
|---|---|---|---|
| 4,414,125 A | * 11/1983 | Keil, deceased et al. | ..... 252/75 |
| 4,892,612 A | * 1/1990 | Huff | ............................ 438/693 |
| 5,516,346 A | 5/1996 | Cadien et al. | |
| 5,854,145 A | * 12/1998 | Chandler et al. | ............. 442/59 |
| 5,959,359 A | * 9/1999 | Tsuchiya | .................... 257/766 |
| 6,063,306 A | * 5/2000 | Kaufman et al. | .......... 252/79.4 |
| 6,140,225 A | * 10/2000 | Usami et al. | ............... 438/637 |

FOREIGN PATENT DOCUMENTS

| | | | |
|---|---|---|---|
| JP | 8-83780 | 3/1996 | |
| JP | 10-44047 | 2/1998 | |
| JP | 10-46140 | 2/1998 | |
| JP | 10-163141 | 6/1998 | |
| JP | 11-238709 | 8/1999 | |
| KR | 2001-010276 | 11/2001 | |
| WO | WO 00/52230 | * 9/2000 | ........... C23F/11/10 |

OTHER PUBLICATIONS

Yasutaka et al. (JP 08083780) (Translation).*
Hayasaki et al. "A new two–step metal–CMP technique for a high performance multilevel interconnects featured by Al and "Cu in low E, organic film" metallizations", 1996, IEEE, pp. 88–89.*

* cited by examiner

*Primary Examiner*—Maria F. Guerrero
(74) *Attorney, Agent, or Firm*—Scully, Scott, Murphy & Presser

(57) ABSTRACT

This invention relates to a process for forming a metal interconnect comprising the steps of forming a concave in an insulating film formed on a substrate, forming a barrier metal film on the insulating film, forming an interconnect metal film over the whole surface such that the concave is filled with the metal and then polishing the surface of the substrate by chemical mechanical polishing, characterized in that the polishing step comprises a first polishing step of polishing the surface such that the interconnect metal film partially remains on the surface other than the concave and a second polishing step of polishing the surface using a polishing slurry controlling a polishing-rate ratio of the interconnect metal to the barrier metal to 1 to 3 both inclusive, until the surface of the insulating film other than the concave is substantially completely exposed. According to this invention, dishing and erosion can be prevented and a reliable damascene interconnect with a small dispersion of an interconnect resistance can be formed.

23 Claims, 3 Drawing Sheets

PROCESS FOR FORMING A METAL INTERCONNECT

BACKGROUND OF THE INVENTION

1. Field of the Invention

This invention relates to a process for forming a damascene metal interconnect using chemical mechanical polishing, which is suitable for manufacturing a semiconductor device.

2. Description of the Prior Art

A damascene interconnect has been conventionally formed by forming a concave such as a groove or connection hole on an insulating film on a substrate, forming a barrier metal film on the insulating film, forming a conductive metal film over the whole surface such that the concave is filled with the metal, and then polishing the surface by chemical mechanical polishing (hereinafter, referred to as "CMP"). It will be described with reference to forming a damascene copper interconnect.

With regard to forming a semiconductor integrated circuit such as ULSI which has been significantly refined and compacted, copper has been expected to be a useful material for electric connection because of its good electromigration resistance and lower electrical resistance.

To date a copper interconnect is formed by a damascene interconnect forming process such as the above CMP due to problems such as difficulty in patterning by dry etching. Specifically, a concave such as a groove and a connection hole is formed in an insulating film, a barrier metal film is formed on the surface, a copper film is deposited over the whole surface by plating such that the concave is filled with the material, and then the surface is polished to be flat by CMP until the surface of the insulating film except the concave area is completely exposed, to form electric connections such as a damascene connection interconnect in which the concave is filled with copper, a via plug and a contact plug.

There will be described a process for forming a damascene copper interconnect with reference to FIG. 1.

As shown in FIG. 1(a), on a silicon substrate 1 are sequentially formed a silicon nitride film 2 and a silicon oxide film 3. On the silicon oxide film 3 is formed a concave having an interconnect pattern and reaching the silicon nitride film 2.

Then, as shown in FIG. 1(b), a barrier metal film 4 is formed by sputtering. On the film is formed a copper film 5 by plating such that the concave is filled with the material.

As shown in FIG. 1(c), the copper film 5 is polished by CMP to make the substrate surface flat. Polishing by CMP is continued until the metal over the silicon oxide film 3 is completely removed, as shown in FIG. 1(d).

In the above process for forming a damascene metal interconnect, a barrier metal film is formed as a base film for, e.g., preventing diffusion of the interconnect metal into the insulating film. However, when using a chemically quite stable metal including a tantalum-containing metal such as Ta and TaN as a barrier metal film, a polishing rate for the barrier metal film is smaller than that for the interconnect metal film in CMP using a conventional polishing slurry, i.e., there is a significant difference between the polishing rates for the barrier metal film and the interconnect metal film, which may cause dishing and erosion.

Dishing is a phenomenon that the interconnect metal in the concave is excessively polished so that the center of the interconnect metal film in the concave is depressed in relation to the plane of the insulating film on the substrate, as shown in FIG. 2. CMP using a conventional polishing slurry requires an adequately much polishing time for completely removing the barrier metal film 4 on the insulating film (silicon oxide film 3) because of a lower polishing rate for the barrier metal film. The polishing rate for the interconnect metal film (copper film 5) is higher than that for the barrier metal film 4, so that the interconnect metal film (copper film 5) is excessively polished, resulting in dishing.

Erosion is a phenomenon that polishing in a dense interconnect area excessively proceeds in relation to that in a sparse area such as an isolated interconnect area so that the surface of the dense interconnect area becomes depressed in relation to the other surfaces, as shown in FIG. 1(d). When the dense interconnect area comprising many damascenes of the interconnect metal film (copper film 5) is considerably separated from the isolated interconnect area comprising less damascenes of the interconnect metal film (copper film 5) by, for example, an area without interconnects within the wafer, and the interconnect metal film (copper film 5) is polished faster than the barrier metal film 4 or the insulating film (silicon oxide film 3), then a polishing pad pressure to the barrier metal film 4 or the insulating film (silicon oxide film 3) in the dense interconnect area becomes higher than that in the isolated interconnect area. As a result, in the CMP process after exposing the barrier metal film 4 (the process of FIG. 1(c) and thereafter), there generates a difference in a polishing rate between the dense interconnect area and the isolated interconnect area, so that the insulating film in the dense interconnect area is excessively polished, resulting in erosion.

Dishing in the process for forming a damascene interconnect in a semiconductor device as described above, may cause increase in an interconnection resistance and a contact resistance, and tends to cause electromigration, leading to poor reliability in the device. Erosion may adversely affect flatness in the substrate surface, which becomes more prominent in a multilayer structure, causing problems such as increase and dispersion in an interconnect resistance.

JP-A 8-83780 has described that dishing in a CMP process may be prevented by using a polishing slurry containing benzotriazole or its derivative and forming a protective film on a copper surface. JP-A 11-238709 has also described that a triazole compound is effective for preventing dishing. The technique, however, controls dishing by reducing a polishing rate for a copper film. Thus, a difference in a polishing rate between a copper film and a barrier metal film may be reduced, but polishing of the copper film takes a longer time, leading to a lower throughput. These publications have not discussed about erosion.

JP-A 10-44047 has described in its Examples that CMP may be conducted using a polishing slurry containing an alumina polishing material, ammonium persulfate (an oxidizing agent) and a particular carboxylic acid to increase a difference in a polishing rate between an aluminum layer for interconnection and a silicon oxide film and to increase a removal rate for a titanium film as a barrier metal film. The technique in the Examples cannot solve the above problems of dishing and erosion when using a chemically quite stable metal such as a tantalum-containing metal as a barrier metal film.

JP-A 10-46140 has described a polishing composition comprising a particular carboxylic acid, an oxidizing agent and water whose pH is adjusted by an alkali to 5 to 9. Examples in the publication have disclosed a polishing composition containing malic acid, citric acid, tartaric acid or oxalic acid as a carboxylic acid and aluminum oxide as a polishing material (Examples 1 to 4, 7, 8 and 11) and a polishing composition comprising malic acid as a carboxylic acid and silicon oxide as a polishing material (Example 12). However, this publication has described only improvement in a polishing rate and prevention of occurring dishing associated with a corrosion mark as an effect of addition of a carboxylic acid such as citric acid, and there are no descriptions for polishing a barrier metal film or erosion.

JP-A 10-163141 has disclosed a polishing composition for a copper film containing a polishing material and water, further comprising an iron (III) compound dissolved in the composition. Examples in the publication has described that a polishing rate for a copper film may be improved and surface defects such as dishing and scratches may be prevented, by using colloidal silica as a polishing material and iron (III) citrate, ammonium iron (III) citrate or ammonium iron (III) oxalate as an iron (III) compound. This publication has no descriptions about polishing for a barrier metal film consisting of a chemically quite stable metal such as a tantalum-containing metal or erosion.

JP-A 11-21546 has disclosed a slurry for chemical mechanical polishing comprising urea, a polishing material, an oxidizing agent, a film-forming agent and a complex-forming agent. Examples in this publication have described polishing Cu, Ta and PTEOS using a slurry having pH 7.5 prepared using alumina as a polishing material, hydrogen peroxide as an oxidizing agent, benzotriazole as a film-forming agent and tartaric acid or ammonium oxalate as a complex-forming agent. The publication, however, has described only that addition of the complex-forming agent such as tartaric acid and ammonium oxalate is effective for disturbing a passive layer formed by a film-forming agent such as benzotriazole and for limiting a depth of an oxidizing layer. It has described about Ta and TaN as examples for a barrier metal, but there are no descriptions about polishing for a barrier metal film consisting of a chemically quite stable metal such as a tantalum-containing metal or erosion.

SUMMARY OF THE INVENTION

An objective of this invention is to provide a process for forming a metal interconnect, which can prevent dishing and erosion and can allow us to form a reliable damascene interconnect with a smaller dispersion in an interconnect resistance.

This invention provides a process for forming a metal interconnect comprising the steps of forming a concave in an insulating film formed on a substrate, forming a barrier metal film on the insulating film, forming an interconnect metal film over the whole surface such that the concave is filled with the metal and then polishing the surface of the substrate by chemical mechanical polishing, characterized in that the polishing step comprises a first polishing step of polishing the surface such that the interconnect metal film partially remains on the surface other than the concave and a second polishing step of polishing the surface using a polishing slurry controlling a polishing-rate ratio of the interconnect metal to the barrier metal to 1 to 3 both inclusive, until the surface of the insulating film other than the concave is substantially completely exposed.

This invention also provides the process for forming a metal interconnect wherein in the first polishing step, the polishing slurry comprises a polishing material, an oxidizing agent, an organic acid and an alkanolamine represented by general formula (1):

$$NR^1{}_m(R^2OH)_n \tag{1}$$

where $R^1$ is hydrogen or alkyl having 1 to 5 carbon atoms; $R^2$ is alkylene having 1 to 5 carbon atoms; m is an integer of 0 to 2 both inclusive; and n is a natural number of 1 to 3 both inclusive, provided that m+n is 3.

This invention also provides a process for forming a metal interconnect comprising the steps of forming a concave in an insulating film formed on a substrate, forming a barrier metal film on the insulating film, forming an interconnect metal film over the whole surface such that the concave is filled with the metal and then polishing the surface of the substrate by chemical mechanical polishing, characterized in that the polishing step comprises a first polishing step of polishing the surface using a polishing slurry comprising a polishing material, an oxidizing agent, an organic acid and an alkanolamine represented by the above general formula (1) such that the interconnect metal film does not remain on the surface other than the concave while the barrier metal film is not completely removed by polishing and a second polishing step of polishing the surface using a polishing slurry controlling a polishing-rate ratio of the interconnect metal to the barrier metal to 1 or less, until the surface of the insulating film other than the concave is substantially completely exposed.

This invention also provides a process for forming a metal interconnect comprising the steps of forming a concave in an insulating film formed on a substrate, forming a barrier metal film on the insulating film, forming an interconnect metal film over the whole surface such that the concave is filled with the metal and then polishing the surface of the substrate by chemical mechanical polishing using a polishing slurry comprising a silica polishing material and a carboxylic acid represented by general formula (2):

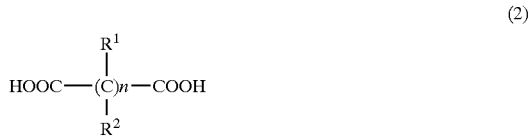

where n is 0, 1, 2 or 3 and each of $R^1$ and $R^2$ is, independently for a carbon atom to which it attaches, hydrogen, —OH or —COOH; or general formula (3):

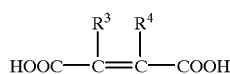

(3)

where each of $R^3$ and $R^4$ is independently hydrogen or —OH.

This invention also provides a process for forming a metal interconnect comprising the steps of forming a concave in an insulating film formed on a substrate, forming a barrier metal film on the insulating film, forming an interconnect metal film over the whole surface such that the concave is filled with the metal and then polishing the surface of the substrate by chemical mechanical polishing using a polishing slurry comprising a silica polishing material and an inorganic salt.

As used herein, the term "a concave" refers to a groove for forming a damascene interconnect or a connection hole such as a contact hole and a through hole. The term "an insulating film formed on a substrate" includes an interlayer insulating film formed on a lower interconnect layer.

This invention can minimize dishing and erosion, and allows us to form a reliable damascene interconnect with a reduced dispersion in an interconnect resistance.

DETAILED DESCRIPTION OF PREFERRED EMBODIMENTS

There will be described preferred embodiments of this invention.

For a process for forming a metal interconnect of this invention, there are two kinds of CMP processes comprising the first and the second polishing steps. The first polishing process will be described.

The first polishing process comprises the first polishing step of polishing the surface such that the interconnect metal film partially remains on the surface other than the concave and the second polishing step of polishing the surface using a polishing slurry controlling a polishing-rate ratio of the interconnect metal to the barrier metal to 1 to 3 both inclusive, until the surface of the insulating film other than the concave is substantially completely exposed.

Figure 3:
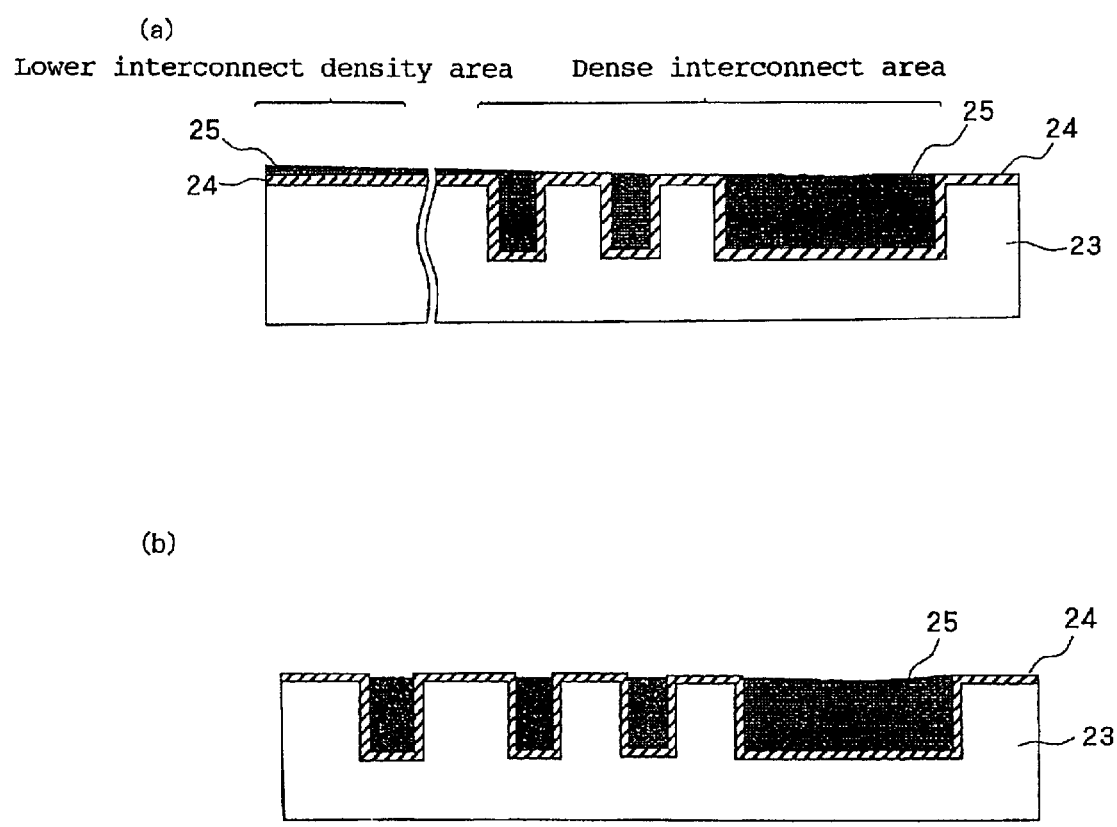
FIG. 3 is a cross section of a damascene interconnect layer illustrating a process for forming a metal interconnect according to this invention.

Generally, when there is a large density difference in an interconnect pattern, polishing in a dense interconnect area is faster than in an area (a sparse interconnect area) with a lower interconnect density such as an area around an isolated interconnect area and a no-interconnect area, as described above. As a result, an insulating film between interconnects in a dense interconnect area is excessively polished together with a metal within a concave, leading to erosion. Thus, as illustrated in FIG. 3(a), CMP may be conducted in the first polishing step such that an interconnect metal film 25 partially remains on the surface other than the concave formed on the insulating film 24, to partially leave the interconnect metal film 25 in a sparse interconnect area and to stop polishing before the insulating film 23 between interconnects in the dense interconnect area is polished.

In the first polishing step, the interconnect metal film 25 remains in preferably 5% to 30%, more preferably to 10% both inclusive of the surface area other than the concave. In the first polishing step, the area of the interconnect metal film 25 on the substrate can be determined as described below.

An end point of polishing is defined as the time when an area with a smallest pattern density is exposed in an area where a polishing rate of a polished surface is slowest. At several polishing points during the period between the end point and the time when a barrier metal film begins to be exposed, each polished surface is observed in advance with an optical microscope and then resulting images are processed to determine a relationship between a polishing period and an area ratio for a remaining interconnect metal film. During polishing in practically forming an interconnect, polishing may be continued from the time when the barrier metal film is exposed to the time corresponding to remaining of a given area of the interconnect metal film, to leaving the interconnect metal film with the substantially given area. The time when the barrier metal film begins to be exposed may be readily determined by detecting a rotation torque. The above end point of polishing corresponds to that when the insulating film other than the concave is completely exposed.

After the first polishing step described above, the second polishing step is conducted, in which the surface is polished with a polishing slurry controlling a polishing-rate ratio of the interconnect metal to the barrier metal to 1 to 3 both inclusive, until the surface of the insulating film other than the concave is substantially completely exposed. If the polishing rate ratio of the polishing slurry (interconnect metal/barrier metal) is less than 1, i.e., if the polishing rate for the interconnect metal film is smaller than that for the barrier metal film, it is difficult to completely remove the partially remaining interconnect metal film, causing problems such as short-circuit between interconnects due to an insufficiently polished part, reduction in a throughput because a polishing period must be longer for preventing the short-circuit, and excessive polishing (erosion) of an area of the already exposed barrier metal or insulating film after the first polishing due to a longer polishing period. On the other hand, if the polishing rate ratio of the polishing slurry (interconnect metal/barrier metal) is more than 3, i.e., if the polishing rate for the interconnect metal film is considerably larger than that for the barrier metal film, the interconnect metal within the concave is excessively polished, resulting in problems such as tendency to dishing, short-circuit because the polishing rate for the barrier metal is sufficiently small to leave the barrier metal on the insulating film, and a reduced throughput or further dishing due to a longer polishing period for preventing the short-circuit. Thus, when in the second polishing step, CMP is conducted using a polishing slurry controlling a polishing rate ratio (interconnect metal/barrier metal) to 1 to 3 both inclusive, there may be formed a damascene interconnection in an improved throughput without leaving the metal on the insulating film other than the concave and without dishing while preventing erosion throughout the first and the second polishing steps. A more preferable polishing rate ratio (interconnect metal/barrier metal) for the polishing slurry used in the second polishing step is 1.5 to 2.5 both inclusive.

There will be described the second polishing process in CMP in a process for forming a metal interconnect according to this invention.

The second polishing process comprises the first polishing step of polishing the surface using a polishing slurry comprising a polishing material, an oxidizing agent, an organic acid and an alkanolamine represented by the above general formula (1) such that the interconnect metal film does not remain on the surface other than the concave while the barrier metal film is not completely removed by polishing and the second polishing step of polishing the surface using a polishing slurry controlling a polishing-rate ratio of the interconnect metal to the barrier metal to 1 or less, until the surface of the insulating film other than the concave is substantially completely exposed.

In the first polishing step of the second polishing process, CMP is conducted such that the interconnect metal film does not remain on the surface other than the concave while the barrier metal film is not completely removed by polishing. For the purpose of this, it is necessary to conduct polishing using a polishing slurry comprising a polishing material, an oxidizing agent, an organic acid and an alkanolamine represented by the above general formula (1) (hereinafter, referred to as "an alkanolamine-containing slurry"). The alkanolamine-containing slurry may be used to allow the barrier metal film 4 to act as a substantial stop film in polishing of the interconnect metal film as shown in FIG. 3(b) for preventing erosion. In the first polishing step, it is preferable in the light of preventing excessive polishing (dishing) of the interconnect metal within the concave to stop polishing such that the barrier metal film remains as much as possible on the insulating film other than the concave, i.e., at the time when the insulating film is not exposed.

In the subsequent second polishing step, CMP is conducted by replacing the above alkanolamine-containing slurry with a polishing slurry controlling a polishing rate ratio of the interconnect metal to the barrier metal to 1 or less, i.e., the polishing rate for the barrier metal film is larger than that for the interconnect metal film. It can prevent dishing and allows us to form a damascene interconnect while minimizing erosion. As described above, in a dense interconnect area, erosion occurs due to a relatively larger polishing rate for the interconnect metal filled in the concave in relation to the barrier metal film or the insulating film. In the second polishing step of the second polishing process, the interconnect metal film is polished more slowly than the barrier metal film remained in the first polishing step, leading to prevention of erosion.

For preventing excessive polishing of the barrier metal film while evenly polishing the interconnection metal film, the polishing slurry used in the first polishing step can desirably control a polishing rate ratio of the interconnect metal film to the barrier metal film (interconnect metal/barrier metal) to preferably at least 30, more preferably at least 50, further preferably at least 100.

The alkanolamine-containing slurry used in the first polishing step of the second polishing process may be suitably used as a polishing slurry in the first polishing step of the first polishing process for enhancing the above function of the barrier metal film as a polishing stopper in the polishing of the interconnect metal film and preventing erosion.

In the first and the second polishing processes, it is preferable that the polishing slurry used in the first polishing step can control a polishing rate for the interconnect metal film of preferably at least 300 nm/min, more preferably at least 400 nm/min in the light of a polishing efficiency and also preferably 1500 nm/min or less, more preferably 1000 nm/min or less in the light of a polishing accuracy and prevention of dishing.

Examples of the alkanolamine represented by general formula (1) include methanolamine, dimethanolamine, trimethanolamine, ethanolamine, diethanolamine, triethanolamine, propanolamine, dipropanolamine, tripropanolamine, butanolamine, dibutanolamine, tributanolamine, N-methylethanolamine, N-ethylethanolamine, N-propylethanolamine and N-butylethanolamine. Among these alkanolamines, ethanolamine, diethanolamine and triethanolamine are preferable and triethanolamine is more preferable because of their higher solubility in an aqueous medium and their higher effect of reduction in a polishing rate for the barrier metal film.

For the purpose of minimizing polishing of the barrier metal film, the content of the above particular alkanolamine is preferably at least 0.01 wt %, more preferably at least 0.2 wt %, further preferably at least 0.5 wt % to the whole amount of the polishing slurry, while for the purpose of preventing an excessively higher pH of the polishing slurry, it is preferably 10 wt % or less, more preferably 5 wt % or less, further preferably 2 wt % or less.

The alkanolamine in the polishing slurry is believed to intervene between the polished surface of the barrier metal film and polishing grains for improving lubricity of the polished surface. Thus, The alkanolamine-containing slurry may be used to improve slipperiness of the polishing grains on the polished surface, leading to reduction in a mechanical polishing effect with polishing grains. For a barrier metal film comprising a chemically stable metal such as a tantalum-containing metal, mechanical polishing is predominant in CMP for a tantalum-containing metal film while contribution of chemical polishing is small. Thus, the alkanolamine-containing slurry may minimize mechanical polishing for the barrier metal film, i.e., it may reduce a polishing rate for the barrier metal film. On the other hand, in CMP for the interconnect metal film, contribution of chemical polishing is adequately large to prevent excessive reduction in a polishing rate for the interconnect metal film. As a result, the alkanolamine-containing slurry may reduce a polishing rate for the barrier metal film while increasing a difference in a polishing rate between the barrier metal film and the interconnect metal film, to enhance the function of the barrier metal film as a stop film (a polishing stopper) in polishing of the interconnect metal film.

There will be described a polishing slurry suitable for the second polishing step of the first or the second polishing process.

In the process for forming a metal interconnect according to this invention, the polishing slurry used in the second polishing step controls a polishing rate ratio (interconnect metal/barrier metal) to 1 to 3 both inclusive in the first polishing process while controlling it to 1 or less in the second polishing process. In both of the first and the second polishing processes, the polishing slurry used in the second polishing step preferably controls a polishing rate ratio of the insulating film to the barrier metal to 0.01 to 0.5 both inclusive.

In the prior art, when using a chemically stable metal (for example, an oxidation resistant metal) such as a tantalum-containing metal as a barrier metal film, a polishing rate ratio (interconnect metal/barrier metal) of 3 or less or 1 or less has been achieved only by reducing contribution of chemical polishing by reduction of an oxidizing agent or addition of an antioxidant to reduce a polishing rate for the interconnect metal film. In such a technique, a polishing rate for the barrier metal film remains at a low level and tends to leave an insufficiently polished part, which may cause short-circuit between interconnects. On the other hand, increase in a polishing time for preventing the problem may leads to problems such as a reduced throughput, and excessive strengthening of mechanical polishing may cause problems such as scratches or erosion in the polished surface. Thus, the polishing step of the process for forming a metal interconnect according to this invention employs a polishing slurry which can control a polishing rate ratio (interconnect metal/barrier metal) to a desired level by increasing a polishing rate for the barrier metal film.

There are two types of the polishing slurries. The first type of the slurry will be described.

The first slurry comprises a silica polishing material, a carboxylic acid represented by the above formula (2) or (3) (hereinafter, referred to as a"polycarboxylic acid") and water. An oxidizing agent is preferably contained for enhancing polishing the interconnect metal film formed on the barrier metal film.

As a silica polishing material, polishing grains consisting of silicon dioxide may be used; for example, fumed silica and colloidal silica. A silica polishing material may be prepared by a variety of known processes; for example, fumed silica by vapor phase synthesis via reaction of silicon tetrachloride in a flame of oxygen and hydrogen, and silica prepared by hydrolyzing a metal alkoxide in a liquid phase and then baking it. In manufacturing a semiconductor device, among these polishing grains consisting of silicon dioxide, fumed silica is preferable because of its lower price and its lower Na content as an impurity.

An average particle size (diameter) of the silica polishing material is preferably at least 5 nm, more preferably at least 50 nm, and also preferably 500 nm or less, more preferably 300 nm or less as determined by a light scattering diffraction technique. A particle size distribution is preferably 3 $\mu$m or less, more preferably 1 $\mu$m or less for the maximum particle size (d100). A specific surface area is preferably at least 5 $m^2/g$, more preferably at least 20 $m^2/g$ and also 1000 $m^2/g$ or less, more preferably 500 $m^2/g$ or less as determined by B.E.T.

A content of the silica polishing material in the polishing slurry may be appropriately selected within the range of 0.1 to 50 wt % to the total amount of the slurry composition in the light of factors such as a polishing efficiency and polishing accuracy. It is preferably at least 1 wt %, more preferably at least 2 wt %, further preferably at least 3 wt % while an upper limit may be preferably 30 wt %, more preferably 10 wt %, further preferably 8 wt %.

The carboxylic acid used in the first slurry is one having two or more carboxyl groups in one molecule; for example, oxalic acid, malonic acid, tartaric acid, malic acid, glutaric acid, citric acid, maleic acid and their salts as well as a mixture of two or more of them.

The content of the polycarboxylic acid is preferably at least 0.01 wt %, more preferably at least 0.05 wt % to the total amount of the slurry composition for improving a polishing rate for the tantalum-containing metal film while it is preferably 1 wt % or less, more preferably 0.8 wt % or less for preventing thixotropy in the polishing slurry.

The first slurry comprising silica polishing grains as a polishing material and the above polycarboxylic acid may significantly improve a polishing rate for the tantalum-containing metal film while preventing generation of scratches in a polished surface. Thus, a difference in a polishing rate between the barrier metal film and the interconnect metal film can be minimized by improving a polishing rate for the tantalum-containing metal film, so that dishing and erosion can be prevented to allow us to form a good damascene interconnect without reducing a throughput.

It is believed that the above polycarboxylic acid aggregates silica particles dispersed in water (flocculation) and the aggregated silica particles by the carboxylic acid enhance mechanical effect, resulting in good polishing of the barrier metal film. The aggregation may be properly weak and relatively soft aggregated particles may be formed, so that a polishing rate for the barrier metal film can be improved while preventing scratches in the polished surface.

There will be the second slurry.

The second slurry comprises a silica polishing material, an inorganic salt and water.

The inorganic salt may be at least one salt selected from the group of hydroacid salts, oxo acid salts, peroxo acid salts and halogen oxo acid salts.

Examples of hydroacid salts include salts of hydrofluoric acid, hydrochloric acid, hydrobromic acid, hydroiodic acid, hydrogen sulfide, hydrocyanic acid, hydrazoic acid, chloroauric acid and chloroplatinic acid.

Examples of oxo acid salts include sulfates, nitrates, phosphates, carbonates, borates, uranates, chromates, tungstates, titanates and molybdates.

Examples of peroxo acid salts include peroxomonosulfates, peroxodisulfates, peroxonitrates, peroxomonophosphates, peroxodiphosphates, peroxomonocarbonates, peroxodicarbonates, peroxoborates, peroxouranates, peroxochromates, peroxotungstates, peroxotitanates and peroxomolybdates.

Examples of halogen oxo acid salts include perchlorates, perbromates and periodates.

A peroxo acid salt or halogen oxo acid salt is preferable because it acts as an oxidizing agent to chemically improve a polishing rate for the interconnect metal film. In other words, it can be used as an alternative or adjuvant for an oxidizing agent added in a polishing slurry used in manufacturing a semiconductor device.

The inorganic salt may be at least one salt selected from salts containing ammonium ion, an alkali metal ion, an alkali-earth metal ion, a group IIIB metal ion, a group IVB metal ion, a group VB metal ion and a transition metal ion.

Examples of an alkali metal ion include Li, Na, K, Rb, Cs and Fr ions. Examples of an alkali-earth metal ion include Be, Mg, Ca, Sr, Ba and Ra ions. Examples of a group IIIB metal ion include Al, Ga, In and Tl ions. Examples of a group IVB metal ion include Sn and Pb ions. An example of a group VB metal ion is Bi ion. Examples of a transition metal ion include lanthanide metal ions such as Sc, Ti, V, Cr, Mn, Fe, Co, Ni, Cu, Zn, Y, Zr, Nb, Mo, Tc, Ru, Rh, Pd, Ag, Cd and La ions, and actinoid metal ions such as Hf, Ta, W, Re, Os, Ir, Hg and Ac ions.

Among the above inorganic salts, preferable salts are potassium and ammonium salts and particularly preferable salts include potassium sulfate, ammonium sulfate, potassium chloride, potassium peroxodisulfate, ammonium peroxodisulfate and ammonium periodate.

Two or more of the above inorganic salts may be combined. When preparing a semiconductor device, an inorganic salt preferably contains Na or a heavy metal as little as possible. It is because Na may readily react with Si and therefore it tends to adhere and remain on an Si substrate even after washing, and a heavy metal tends to remain.

The content of the above inorganic salt is preferably at least 0.01 wt %, more preferably at least 0.05 wt % for improving a polishing rate for the barrier metal film. While as its upper limit it is preferably 10 wt % or less, preferably 5 wt % or less for preventing thixotropy in a polishing slurry. When combining two or more inorganic salts, the above content means their total.

As a silica polishing material, polishing grains as in the first slurry may be used in a similar content.

The second slurry contains silica grains and an inorganic salt, allowing us to significantly improve a polishing rate for the barrier metal film while preventing scratches in a polished surface. Thus, the polishing rate for the barrier metal film may be improved to reduce a difference in a polishing rate between the barrier metal film and the interconnect metal film, so that dishing and erosion can be prevented without reducing a throughput and therefore, a good damascene interconnect may be formed.

It is believed that the above inorganic salt aggregates silica particles dispersed in water (flocculation) and the aggregated silica particles by the inorganic salt enhance mechanical polishing effect, resulting in good polishing of the barrier metal film. The aggregation may be properly weak and relatively soft aggregated particles may be formed, so that a polishing rate for the barrier metal film can be improved while preventing scratches in the polished surface.

CMP using the first or the second slurries described above may allow us to form a reliable damascene interconnect exhibiting improved electric properties with a higher polishing rate, i.e., a higher throughput while preventing dishing and erosion. A slurry may be used, which comprises both of a polycarboxylic acid and an inorganic salt as main components in the first and the second slurries, respectively.

The first and the second slurries controls a polishing rate for the barrier metal film to preferably at least 25 nm/min, more preferably at least 30 nm/min, further preferably at least 35 nm/min. while as its upper limit, especially in the first polishing process, the polishing rate is preferably 100 nm/min or less, more preferably 80 nm/min or less, further preferably 70 nm/min or less.

The first and the second slurries can be suitably used in the first and the second polishing processes where polishing is conducted in two steps. Furthermore, these slurries may be suitably used in a process where polishing is conducted in one step, to form a reliable damascene interconnect exhibiting improved electric properties with a higher throughput than the prior art while preventing dishing and erosion, by adjusting a polishing rate ratio (interconnect metal/barrier metal). A preferable polishing rate ratio (interconnect metal/barrier metal) is about 1 for the process where polishing is conducted in one step. Specifically, it is preferably at least 0.5, more preferably at least 0.8 while as its upper limit it is preferably 2, more preferably 1.5, further preferably 1.2.

There will be further described the first slurry, the second slurry and the alkanolamine-containing slurry. Unless otherwise specified, a polishing slurry means one of these slurries.

While the first and the second slurries must comprise a polishing material containing polishing grains consisting of silica as a main component, the alkanolamine-containing slurry may contain, not limited to a silica polishing material, a variety of polishing materials. For example, it may contain a component selected from the group of aluminas such as α-alumina, θ-alumina, γ-alumina and fumed alumina; silicas such as fumed silica and colloidal silica; titania; zirconia; germania; ceria; and a combination of two or more selected from these metal oxide polishing grains. Among these, silica and alumina are preferable.

In the light of a polishing rate and corrosion, a slurry viscosity and dispersion stability of a polishing material, a polishing slurry has a pH of preferably at least 4, more preferably at least 5 and preferably 9 or less, more preferably 8 or less.

For the polishing slurry, pH may be adjusted by a known technique. For example, an alkali may be directly added to a slurry in which a polishing material is dispersed and an organic acid is dissolved. Alternatively, a part or all of an alkali to be added may be added as an organic acid alkali salt. Examples of an alkali which may be used include alkali metal hydroxides such as sodium hydroxide and potassium hydroxide; alkali metal carbonates such as sodium carbonate and potassium carbonate; ammonia; and amines.

It is preferable to add an oxidizing agent to a polishing slurry for enhancing polishing of the interconnect metal film. However, for the second polishing process, when the interconnect metal film is completely removed on the barrier metal film other than the concave in the first polishing step, a polishing slurry used in the second polishing step may not contain an oxidizing agent.

The oxidizing agent may be appropriately selected from known water-soluble oxidizing agents in the light of a type of a interconnect metal film, polishing accuracy and a polishing efficiency. For example, those which may not cause heavy-metal ion contamination include peroxides such as $H_2O_2$, $Na_2O_2$, $Ba_2O_2$ and $(C_6H_5C)_2O_2$; hypochlorous acid (HClO); perchloric acid; nitric acid; ozone water; and organic acid peroxides such as peracetic acid and nitrobenzene. Among these, hydrogen peroxide ($H_2O_2$) is preferable because it does not contain a metal component and does not generate a harmful byproduct. The content of the oxidizing agent in the polishing slurry is preferably at least 0.01 wt %, more preferably at least 0.05 wt % for achieving adequate effects of its addition while it is preferably 15 wt % or less, more preferably 10 wt % or less for preventing dishing and adjusting a polishing rate to a proper value. When using an oxidizing agent which is relatively susceptible to deterioration with age such as hydrogen peroxide, it may be possible to separately prepare a solution containing an oxidizing agent at a given concentration and a composition which provides a given polishing slurry after addition of the solution containing an oxidizing agent, which are then combined just before use.

An organic acid such as known carboxylic acids and amino acids may be added as a proton donor for enhancing oxidization by the oxidizing agent and achieving stable polishing. Although a polycarboxylic acid represented by formula (2) or (3) may act as such a proton donor, a different organic acid such as a carboxylic acid and an amino acid may be added.

Carboxylic acids other than a polycarboxylic acid represented by formula (2) or (3) include formic acid, acetic acid, propionic acid, butyric acid, valeric acid, acrylic acid, lactic acid, succinic acid, nicotinic acid and their salts.

An amino acid may be added as such, as a salt or as a hydrate. Examples of those which may be added include arginine, arginine hydrochloride, arginine picrate, arginine flavianate, lysine, lysine hydrochloride, lysine dihydrochloride, lysine picrate, histidine, histidine hydrochloride, histidine dihydrochloride, glutamic acid, glutamic acid hydrochloride, sodium glutaminate monohydrate, glutamine, glutathione, glycylglycine, alanine, β-alanine, γ-aminobutyric acid, ε-aminocarproic acid, aspartic acid, aspartic acid monohydrate, potassium aspartate, potassium aspartate trihydrate, tryptophan, threonine, glycine, cystine, cysteine, cysteine hydrochloride monohydrate, oxyproline, isoleucine, leucine, methionine, ornithine hydrochloride, phenylalanine, phenylglycine, proline, serine, tyrosine, valine, and a mixture of these amino acids.

The content of the organic acid is preferably at least 0.01 wt %, more preferably at least 0.05 wt % to the total amount of the polishing slurry for achieving adequate effects of its addition, while it is preferably 5 wt % or less, more preferably 3 wt % or less as a content including the polycarboxylic acid represented by formula (2) or (3) for preventing dishing and adjusting a polishing rate to a proper value.

When adding an oxidizing agent in a polishing slurry, an antioxidant may be further added. Addition of an antioxidant may allow a polishing rate for a interconnect metal film to be easily adjusted and may result in forming a coating film over the surface of the interconnect metal film to prevent dishing.

Examples of an antioxidant include benzotriazole, 1,2,4-triazole, benzofuroxan, 2,1,3-benzothiazole, o-phenylenediamine, m-phenylenediamine, cathechol, o-aminophenol, 2-mercaptobenzothiazole, 2-mercaptobenzimidazole, 2-mercaptobenzoxazole, melamine, and their derivatives. Among these, benzotriazole and its derivatives are preferable. Examples of a benzotriazole derivative include substituted benzotriazoles having a benzene ring substituted with hydroxy; alkoxy such as methoxy and ethoxy; amino; nitro; alkyl such as methyl, ethyl and butyl; halogen such as fluorine, chlorine, bromine and iodine. Furthermore, naphthalenetriazole and naphthalenebistriazole as well as substituted naphthalenetriazoles and substituted naphthalenebistriazoles substituted as described above may be used.

The content of the antioxidant is preferably at least 0.0001 wt %, more preferably at least 0.001 wt % to the total amount of the polishing slurry for achieving adequate effects of its addition, while it is preferably 5 wt % or less, more preferably 2.5 wt % or less for adjusting a polishing rate to a proper value.

A polishing slurry may contain a variety of additives such as dispersing agents, buffers and viscosity modifiers commonly added to a polishing slurry as long as it does not deteriorate the properties of the slurry.

A polishing slurry may be prepared by a common process for preparing a free grain polishing slurry. Specifically, polishing grain particles are added to a dispersion medium to an appropriate amount. A protective agent may be, if necessary, added to an appropriate amount. In such a state, air is strongly adsorbed in the surface of the grain particles, so that the grains are aggregated due to poor wettability. Thus, the aggregated polishing material particles are dispersed into primary particles. In a dispersion process, a dispersion technique and a dispersion apparatus commonly used may be employed. Specifically, dispersion may be conducted using an apparatus such as an ultrasonic disperser, a variety of bead mill dispersers, a kneader and a ball mill by a known process. A polycarboxylic acid represented by formula (2) or (3) or an inorganic salt may cause flocculation of silica particles while enhancing thixotropy. It is, therefore, preferable to add and mix the component after dispersion for achieving good dispersion.

Polishing in a CMP process in this invention may be conducted using a common CMP apparatus described below. A wafer on which an interconnect metal film is deposited is placed on a spindle wafer carrier. The surface of the wafer is contacted with a polishing pad made of, e.g., porous urethane adhered on a rotary plate (surface plate). While supplying a polishing slurry to the surface of the polishing pad from a polishing slurry inlet, both the wafer and the polishing pad are rotated to polish the wafer. If necessary, a pad conditioner is contacted with the surface of the polishing pad to condition the surface of the polishing pad.

There will be described a polishing termination operation.

In the first polishing step of the first polishing process, for example, polishing is terminated after a given period from the time when the barrier metal film is exposed, on the basis of a predetermined relationship between a polishing time and an area ratio of a remaining interconnect metal film as described above.

Polishing in the other polishing steps may be terminated, for example, as follows.

As an example, a polishing rate for the metal film is determined in advance to estimate a time required for removing a metal film with a given thickness. After initiating polishing, polishing is terminated after a given time from the time when the estimated period elapses.

As another example, CMP is conducted while measuring a polishing rate and polishing is terminated after a given time from the time when the polishing rate begins to rapidly decrease.

As a further example, CMP is conducted while measuring change in a rotation torque to a rotation axis with a rotation torque meter placed on the rotation axis of the rotary plate. Then, polishing is terminated after a given time from the time when change is detected in a rotation torque associated with exposure of the barrier metal film by removing a interconnect metal film.

As a further example, light is irradiated to a polished surface to conduct CMP while measuring reflected light. Specifically, as polishing proceeds to an interconnect metal film, a barrier metal film and an insulating film, a material exposed in the polished surface is changed, resulting in change in reflected light. Polishing is terminated after a given time from the time when the intensity of the reflected light changes.

An end point may be determined by appropriately combining these technique.

In the above process for forming a metal interconnect according to this invention, examples of an insulating film include a silicon oxide film, a BPSG film and an SOG film. Examples of an interconnect metal include copper, silver, gold, platinum, titanium, tungsten, aluminum, and their alloys. Examples of a barrier metal include Ta, TaN, Ti, TiN, W, WN and WSiN. The process for forming a metal interconnect according to this invention is suitable to the case where the interconnect metal film is mainly made of copper or a copper alloy containing copper as a main component, and the barrier metal film is made of Ta or TaN.

The process for forming a metal interconnect may be applied to a variety of conventional processes for forming a damascene interconnect. For example, it may applied to forming an upper interconnect layer with a multilayer interconnect structure or forming a dual damascene interconnect.

EXAMPLES

This invention will be described with reference to Examples.

Preparation of a Substrate for CMP

Figure 1:
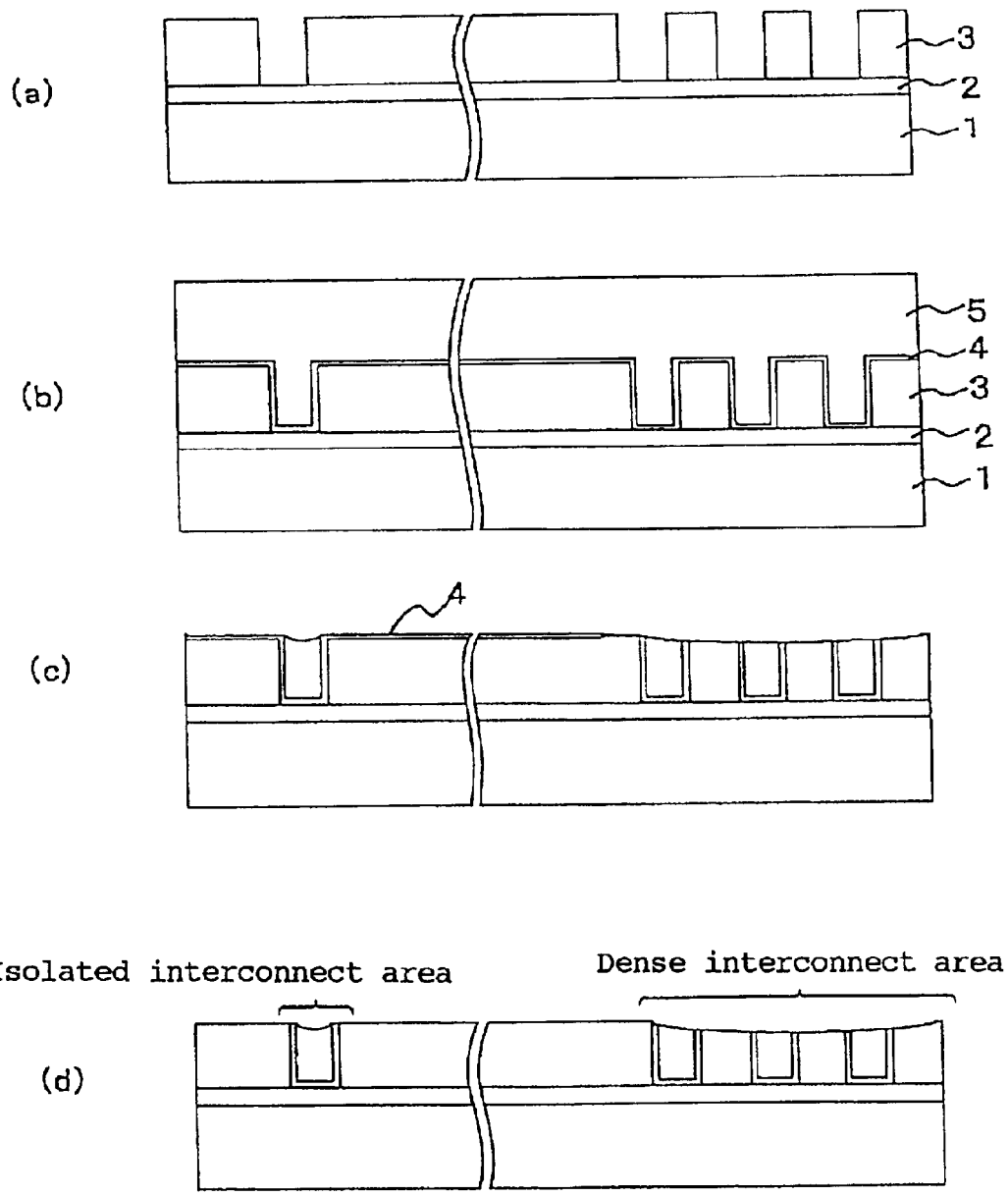
FIG. 1 is a process cross section illustrating a process for forming a metal interconnect according to the prior art.
Figure 2:
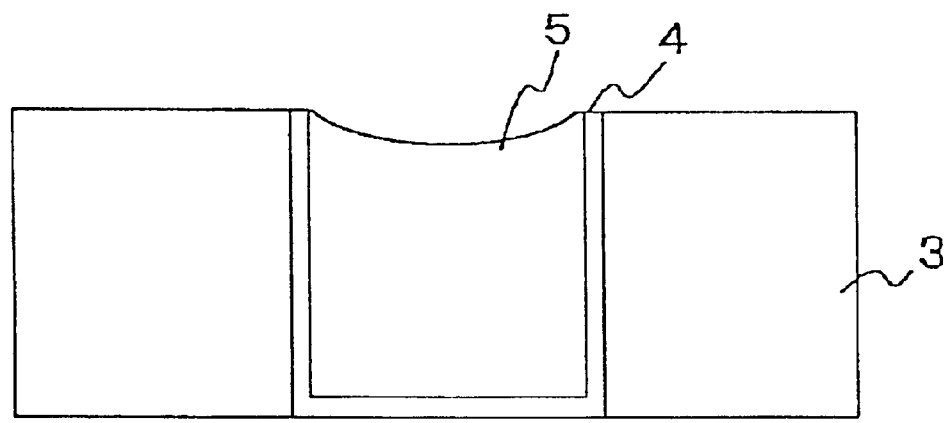
FIG. 2 shows a cross section of an interconnect when forming a damascene copper interconnect by a process for forming a metal interconnect according to the prior art.

On a 6 inch wafer (silicon substrate, not shown) in which a semiconductor device such as a transistor was formed was deposited a lower interconnect layer 1 made of a silicon oxide film comprising a lower interconnect (not shown). On the lower interconnect layer was, as shown in FIG. 1(*a*), formed a silicon nitride film 2, on which was formed a silicon oxide film 3 with a thickness of about 500 nm. The silicon oxide film 3 was patterned by photolithography and reactive ion etching as usual to form a groove for interconnection and a connection hole with a width of 0.23 to 10 μm and a depth of 500 nm. Then, as shown in FIG. 1(*b*), Ta film (tantalum film) 4 was formed to a thickness of 50 nm by sputtering, a copper film was formed to a thickness of about 50 nm by sputtering, and then a copper film was formed to a thickness of about 800 nm by plating.

In Example 20, for the purpose of determining a polishing rate of a Ta film (barrier metal film), a Ta film was deposited on a 6 inch silicon substrate by sputtering, which was used as a substrate for CMP.

CMP Conditions

CMP was conducted using a Speedfam-Ipec Type 372 apparatus. The polisher was used, on whose surface plate a polishing pad (Rodel-Nitta IC 1400) was attached. Polishing conditions were as follows: a polishing load (a contact pressure of the polishing pad): 27.6 kPa; a rotating speed of the surface plate: 55 rpm; a carrier rotating speed: 55 rpm; and a polishing slurry feeding rate: 100 mL/min.

Determination of a Polishing Rate

Four needle electrodes were aligned on a wafer with a given interval. A given current was applied between the outer two probes to detect a potential difference between two inner probes for determining a resistance (R') and further the value is multiplied by a correction factor RCF (Resistivity Correction Factor) to a surface resistivity (ρs'). A surface resistivity (ρs) is determined for a wafer film whose thickness (T) (nm) is known. The surface resistivity is inversely proportional to the thickness. Thus, when a thickness for a surface resistivity of ρs' is d, an equation $d(nm)=(\rho s \times T)/\rho s'$ holds true. Using the equation, the thickness d can be determined. Furthermore, a variation of thickness between before and after polishing was divided by a polishing time to estimate a polishing rate. A surface resistivity was determined using Mitsubishi Chemical Industries Four Probe Resistance Detector (Loresta-GP).

Examples 1 to 6

The Second Polishing Process, an Alkanolamine-containing Slurry

As shown in Table 1, a polishing slurry (alkanolamine-containing slurry) was prepared, which comprised 5 wt % of θ alumina (Sumitomo Chemical Industries; AKP-G008), 1.5 wt % of citric acid (Kanto Chemical Co.), 2.5 wt % of $H_2O_2$ (Kanto Chemical Co.) and 0.01 to 10 wt % of triethanolamine (Kanto Chemical Co.) and whose pH was adjusted to 5.5 with KOH. Using the polishing slurry, CMP was conducted until the copper film on the insulating film other than the concave was completely removed. Then, replacing the polishing slurry with the polishing slurry of Example 21 later described (a polishing rate ratio (Cu/Ta)=0.15), CMP was conducted until the surface of the insulating film other than the concave was completely exposed.

As Comparative Example 1, a polishing slurry was prepared as described in Examples 1 to 6, except that triethanolamine was omitted, and then CMP was conducted in one step.

The results are shown in Table 1. As seen from Table 1, addition of triethanolamine significantly reduced a polishing rate for the Ta film. The cross section of the substrate in each example was observed by SEM and it was found that dishing and erosion was prevented.

Examples 7 and 8

The Second Polishing Process, an Alkanolamine-containing Slurry

As shown in Table 1, a polishing slurry was prepared and CMP was conducted as described in Example 3, replacing triethanolamine with diethanolamine or ethanolamine.

The results are shown in Table 1. As seen from Table 1, addition of diethanolamine or ethanolamine also significantly reduced a polishing rate for the Ta film. The cross section of the substrate was observed by SEM and it was found that dishing and erosion was prevented.

Example 9

The Second Polishing Process, an Alkanolamine-containing Slurry

As shown in Example 9 in Table 1, a polishing slurry was prepared and CMP was conducted as described in Example 3, replacing alumina with fumed silica (Tokuyama Qs-9) as abrasion grains.

The results are shown in Table 1. As seen from Table 1, when using silica as abrasion grains, addition of triethanolamine also significantly reduced a polishing rate for the Ta film. The cross section of the substrate was observed by SEM and it was found that dishing and erosion was prevented.

Examples 10 to 13

The Second Polishing Process, an Alkanolamine-containing Slurry

A polishing slurry was prepared and CMP was conducted as described in Example 3, replacing citric acid with one of the organic acids indicated in Examples 10 to 13 in Table 1.

The results are shown in Table 1. As seen from Table 1, when using an organic acid other than citric acid, addition of triethanolamine also significantly reduced a polishing rate for the Ta film. The cross section of the substrate was observed by SEM and it was found that dishing and erosion was prevented.

TABLE 1

| | Polishing grain (content/wt %) | Organic acid (content/wt %) | Alkanolamine (content/wt %) | Ta polishing rate (nm/min) |
|---|---|---|---|---|
| Example 1 | Alumina (5) | Citric acid (1.5) | Triethanolamine (0.01) | 9.75 |
| Example 2 | Alumina (5) | Citric acid (1.5) | Triethanolamine (0.50) | 4.67 |
| Example 3 | Alumina (5) | Citric acid (1.5) | Triethanolamine (1.00) | 3.48 |
| Example 4 | Alumina (5) | Citric acid (1.5) | Triethanolamine (2.00) | 2.11 |
| Example 5 | Alumina (5) | Citric acid (1.5) | Triethanolamine (5.00) | 1.02 |
| Example 6 | Alumina (5) | Citric acid (1.5) | Triethanolamine (10.00) | 0.53 |
| Example 7 | Alumina (5) | Citric acid (1.5) | Diethanolamine (1.00) | 3.12 |
| Example 8 | Alumina (5) | Citric acid (1.5) | Ethanolamine (1.00) | 1.89 |
| Example 9 | Silica (5) | Citric acid (1.5) | Triethanolamine (1.00) | 2.11 |
| Example 10 | Alumina (5) | Glutaric acid (1.5) | Triethanolamine (1.00) | 3.69 |
| Example 11 | Alumina (5) | Tartaric acid (1.5) | Triethanolamine (1.00) | 3.45 |
| Example 12 | Alumina (5) | Malic acid (1.5) | Triethanolamine (1.00) | 3.53 |
| Example 13 | Alumina (5) | Glycine (1.5) | Triethanolamine (1.00) | 3.73 |
| Comparative Example 1 | Alumina (5) | Citric acid (1.5) | None | 16.18 |

Examples 14 to 19

The Second Polishing Process, an Alkanolamine-containing Slurry

A polishing slurry was prepared and CMP was conducted as described in Examples 1 to 6, using a mixed acid consisting of 0.16 wt % of glutaric acid, 1.5 wt % of citric acid and 0.3 wt % of glycine as an organic acid and adding 0.005 wt % of benzotriazole as an antioxidant.

As Comparative Example 2, a polishing slurry was prepared and CMP was conducted in one step as described in Examples 14 to 19, except that an alkanolamine was omitted.

The results are shown in Table 2. As seen from Table 2, a polishing rate for the Ta film was significantly reduced and a polishing rate ratio of the copper film to the Ta film was significantly improved. It was found that addition of triethanolamine improved polishing selectivity of the copper film. The cross section of the substrate in the example was observed by SEM and it was found that dishing and erosion was prevented.

TABLE 2

| | Polishing grain (content/wt %) | Organic acid (content/wt %) | Antioxidant (content/wt %) | Alkanolamine (content/wt %) | Ta polishing rate (nm/min) | Cu polishing rate (nm/min) | Polishing rate ratio: Cu/Ta |
|---|---|---|---|---|---|---|---|
| Example 14 | Alumina (5) | Mixed acid (1.96) | Benzotriazole (0.005) | Triethanolamine (0.01) | 9.89 | 1040.5 | 105 |
| Example 15 | Alumina (5) | Mixed acid (1.96) | Benzotriazole (0.005) | Triethanolamine (0.50) | 4.55 | 1013.2 | 223 |
| Example 16 | Alumina (5) | Mixed acid (1.96) | Benzotriazole (0.005) | Triethanolamine (1.00) | 3.48 | 911.1 | 262 |
| Example 17 | Alumina (5) | Mixed acid (1.96) | Benzotriazole (0.005) | Triethanolamine (2.00) | 2.05 | 808.8 | 395 |
| Example 18 | Alumina (5) | Mixed acid (1.96) | Benzotriazole (0.005) | Triethanolamine (5.00) | 1.03 | 543.7 | 528 |
| Example 19 | Alumina (5) | Mixed acid (1.96) | Benzotriazole (0.005) | Triethanolamine (10.00) | 0.47 | 387.6 | 825 |
| Comparative Example 2 | Alumina (5) | Mixed acid (1.96) | Benzotriazole (0.005) | None | 15.32 | 1060.8 | 69 |

Example 20

Polishing of a Ta Film with the First Slurry

For indicating effects of a polycarboxylic acid represented by formula (2) or (3) in a polishing slurry, CMP was conducted using one of the various polishing slurries shown in Tables 3 to 5 for a Ta film deposited by sputtering on a 6 inch silicon substrate, and a polishing rate was determined for each slurry. The silica polishing material used was fumed silica (Tokuyama Qs-9), and slurry No. 1 did not contain a polycarboxylic acid for comparison. Table 3 shows the results obtained using glutaric acid as a polycarboxylic acid in a variety of contents. Table 4 shows the results obtained using glutaric acid as a polycarboxylic acid and a variety of polishing slurry whose pH and pH regulator were different. Table 5 shows the results obtained using a polishing slurry containing one of various polycarboxylic acids.

As seen from Table 3, addition of glutaric acid significantly improved a polishing rate for the Ta film and as the amount (content) of glutaric acid added increased, the polishing rate increased.

Furthermore, the appearance of the polishing slurry was changed by adding glutaric acid from translucent to cloudy. This indicated that a scattering intensity increased due to particles with a large size by aggregation. From the results it is suspected that addition of a polycarboxylic acid caused increase in an ion strength in the solution, which pressed an electric double layer, leading to reduction in an electric repulsion between particles while aggregation (flocculation) occurred due to interaction between the polycarboxylic acid having two or more carboxyl groups in one molecule and the silica particle, and properly soft silica aggregates formed by the aggregation acted as polishing grains to enhance mechanical polishing and thus to improve the polishing rate of the Ta film.

As shown in Tables 3 and 4, polishing could be conducted with a higher polishing rate even when pH of the polishing slurry was varied within the range of 4.5 to 6.5. The results shown in Table 4 indicate that a similarly higher polishing rate was achieved even when replacing the pH regulator from KOH to NH$_4$OH.

The results in Table 5 show that in place of glutaric acid, a polycarboxylic acid having a particular structure represented by formula (2) or (3) may improve a polishing rate for the Ta film. Furthermore, adding any carboxylic acid shown in the table changed the appearance of the polishing slurry from translucent to cloudy.

TABLE 3

| Slurry No. | Polishing material (content/wt %) | Carboxylic acid (content/wt %) | pH regulator | pH | Ta polishing rate (nm/min) |
|---|---|---|---|---|---|
| 1 | Fumed silica (5) | — | KOH | 6.5 | 12.1 |
| 2 | Fumed silica (5) | Glutaric acid (0.02) | KOH | 6.5 | 29.2 |
| 3 | Fumed silica (5) | Glutaric acid (0.04) | KOH | 6.5 | 29.3 |
| 4 | Fumed silica (5) | Glutaric acid (0.08) | KOH | 6.5 | 42.3 |
| 5 | Fumed silica (5) | Glutaric acid (0.16) | KOH | 6.5 | 46.5 |
| 6 | Fumed silica (5) | Glutaric acid (0.27) | KOH | 6.5 | 56.5 |

TABLE 4

| Slurry No. | Polishing material (content/wt %) | Carboxylic acid (content/wt %) | pH regulator | pH | Ta polishing rate (nm/min) |
|---|---|---|---|---|---|
| 7 | Fumed silica (5) | Glutaric acid (0.16) | KOH | 4.5 | 51.2 |
| 8 | Fumed silica (5) | Glutaric acid (0.16) | KOH | 5.0 | 52.5 |
| 9 | Fumed silica (5) | Glutaric acid (0.16) | KOH | 5.5 | 50 |
| 10 | Fumed silica (5) | Glutaric acid (0.16) | NH$_4$OH | 4.5 | 50.9 |
| 11 | Fumed silica (5) | Glutaric acid (0.16) | NH$_4$OH | 5.0 | 52.1 |
| 12 | Fumed silica (5) | Glutaric acid (0.16) | NH$_4$OH | 5.5 | 49.3 |

TABLE 5

| Slurry No. | Polishing material (content/wt %) | Carboxylic acid (content/wt %) | pH regulator | pH | Ta polishing rate (nm/min) |
|---|---|---|---|---|---|
| 13 | Fumed silica (5) | Malic acid (0.536) | KOH | 5.5 | 58.8 |

TABLE 5-continued

| Slurry No. | Polishing material (content/wt %) | Carboxylic acid (content/wt %) | pH regulator | pH | Ta polishing rate (nm/min) |
|---|---|---|---|---|---|
| 14 | Fumed silica (5) | Tartaric acid (0.6) | KOH | 5.5 | 36.1 |
| 15 | Fumed silica (5) | Maleic acid (0.46) | KOH | 5.5 | 36.2 |
| 16 | Fumed silica (5) | Malonic acid (0.416) | KOH | 5.5 | 46.9 |
| 17 | Fumed silica (5) | Oxalic acid (0.36) | KOH | 5.5 | 48.2 |
| 18 | Fumed silica (5) | Citric acid (0.33) | KOH | 6.5 | 97.1 |

Example 21

One-step Polishing Using The First Slurry

A variety of polishing slurries shown in Table 6 were prepared. Using one of these polishing slurries, CMP was conducted in one step until the surface of an insulating film other than a concave was completely exposed, to determine polishing rates for a copper film, a Ta film and a silicon oxide film ($SiO_2$ insulating film), respectively.

These results show that a polishing rate ratio between the Ta film and the copper film may be adjusted by varying a composition ratio among the polycarboxylic acid represented by formula (2) or (3) or a mixture thereof, the oxidizing agent ($H_2O_2$) and the antioxidant (benzotriazole (BTA)). In the prior art, a polishing rate is adjusted by reducing a polishing rate for a copper film, while in this invention, the polishing rate may be also adjusted (i.e., reduction in a polishing rate difference) by increasing the Ta film, to considerably improve a throughput.

The cross section of the substrate was observed by SEM and it was found that dishing and erosion was prevented. The results show that a properly small difference in polishing rates between the copper film and the Ta film prevented excessive polishing of the copper film and the insulating film has a polishing rate adequately low to act as a stopper for preventing dishing and erosion. Observation of the polished surface by SEM indicated no significant scratches.

Examples 22 to 29

One-step Polishing Using The Second Slurry

Polishing slurries at pH 4.5 were prepared, which comprised 5 wt % of fumed silica (Tokuyama Qs-9) and 0.1 to 3 wt% of potassium sulfate (Kanto Chemical Co.). The polishing slurries were used to conduct CMP in one step until the surface of an insulating film other than a concave was completely exposed, to determine polishing rates for a copper film and a Ta film. The results are shown in Table 7.

As seen in Table 7, addition of potassium sulfate considerably increased the polishing rate for the Ta film without reduction in the polishing rate for the copper film, and an increased amount (content) of potassium sulfate increased the polishing rate for tantalum.

Furthermore, the appearance of the polishing slurry was changed by adding potassium sulfate from translucent to cloudy. This indicated that a scattering intensity increased due to particles with a large size by aggregation. From the results it is suspected that addition of an inorganic salt caused increase in an ion strength in the solution, which pressed an electric double layer, leading to reduction in an electric repulsion between fumed silica particles while aggregation (flocculation) occurred due to interaction between the inorganic salt and the silica particle, and properly soft silica aggregates formed by the aggregation acted as polishing grains to enhance mechanical polishing and thus to improve the polishing rate of the Ta film.

TABLE 7

| | Potassium sulfate (wt %) | Ta polishing rate (nm/mm) | Cu polishing rate (nm/mm) |
|---|---|---|---|
| Comparative Example 3 | 0 | 25.7 | 8.1 |
| Example 22 | 0.10 | 32.1 | Not determined |
| Example 23 | 0.25 | 39.9 | Not determined |
| Example 24 | 0.50 | 50.3 | Not determined |
| Example 25 | 0.75 | 58.5 | Not determined |
| Example 26 | 1.00 | 67.2 | 9.8 |
| Example 27 | 2.00 | 97.1 | Not determined |

TABLE 6

| Slurry No. | Polishing material (content/wt %) | Carboxylic acid (content/wt %) | Anti-oxidant (content/wt %) | Oxidizing agent (content/wt %) | pH regulator | pH | Ta polishing rate (nm/min) | Cu polishing rate (nm/min) | $SiO_2$ polishing rate (nm/min) |
|---|---|---|---|---|---|---|---|---|---|
| 19 | Fumed silica (8) | Glutaric acid (0.16) | BTA (0.005) | $H_2O_2$ (0.093) | KOH | 4.5 | 45.3 | 50.3 | 2.0 |
| 20 | Fumed silica (8) | GLU (0.16) + CIT (0.05)* | BTA (0.005) | $H_2O_2$ (1.53) | KOH | 6.0 | 37 | 80.2 | 2.0 |
| 21 | Fumed silica (8) | Citric acid (0.05) | BTA (0.005) | $H_2O_2$ (1.53) | KOH | 6.0 | 47 | 55.6 | 2.0 |

*GLU: Glutaric acid; CIT: Citric acid

TABLE 7-continued

|  | Potassium sulfate (wt %) | Ta polishing rate (nm/mm) | Cu polishing rate (nm/mm) |
|---|---|---|---|
| Example 28 | 2.50 | 105.1 | Not determined |
| Example 29 | 3.00 | 109.2 | 11.8 |

Examples 30 and 31

One-step Polishing Using The Second Slurry

Polishing slurries were prepared and CMP was conducted as described in Examples 26 and 29, replacing potassium sulfate with ammonium sulfate and potassium chloride, respectively, to determine a polishing rate. The results are shown in Table 8.

As seen in Table 8, a polishing rate for a Ta film was also increased by adding ammonium sulfate or potassium chloride as an inorganic salt other than potassium sulfate.

TABLE 8

|  | Inorganic salt | Conc. of an inorganic salt (wt %) | Ta polishing rate (nm/min) | Cu polishing rate (nm/min) |
|---|---|---|---|---|
| Example 30 | Ammonium sulfate | 1.0 | 59.1 | 9.6 |
| Example 31 | Potassium chloride | 3.0 | 102.1 | 11.1 |

Examples 32 to 37

One-step Polishing Using The Second Slurry

Polishing slurries were prepared and CMP was conducted as described in Examples 24, 26 and 27, replacing potassium sulfate with a variety of oxidizing inorganic salts indicated in Table 9, respectively. For comparison, in Example 37, a polishing slurry was prepared, which comprised potassium sulfate which was a non-oxidizing inorganic salt and 2.5 wt % of hydrogen peroxide, and the results obtained are shown in Table 9 together with the results in Table 26.

As seen in Table 9, a polishing rate for tantalum was also increased by adding an oxidizing inorganic salt. In addition, oxidation by the inorganic salt considerably increased a polishing rate for copper in comparison with Example 26. Compared with Example 37, it was observed that by adding the oxidizing inorganic salt, a polishing rate for copper increased to a similar level to addition of hydrogen peroxide.

TABLE 9

|  | Inorganic salt | Conc. of an inorganic salt (wt %) | Hydrogen peroxide (wt %) | Ta polishing rate (nm/min) | Cu polishing rate (nm/min) |
|---|---|---|---|---|---|
| Example 32 | Potassium peroxodisulfate | 0.5 | 0 | 50.5 | 247.8 |
| Example 33 | Potassium peroxodisulfate | 1.0 | 0 | 71.2 | 468.6 |
| Example 34 | Potassium peroxodisulfate | 2.0 | 0 | 79.8 | 623.2 |
| Example 35 | Ammonium peroxodisulfate | 1.0 | 0 | 68.3 | 480.3 |
| Example 36 | Ammonium periodate | 1.0 | 0 | 69.5 | 470.0 |
| Example 37 | Potassium sulfate | 1.0 | 2.5 | 70.8 | 472.2 |
| Example 26 | Potassium sulfate | 1.0 | 0 | 67.2 | 9.8 |

Examples 38 to 41

One-step Polishing Using The Second Slurry

As shown in Table 10, polishing slurries were prepared, which comprised potassium sulfate, hydrogen peroxide (Kanto Chemical Co.), oxalic acid or malic acid (Kanto Chemical Co.) and benzotriazole (Kanto Chemical Co.). The slurries were used to conduct CMP in one step to determine a polishing rate. The results are shown in Table 10.

Table 10 indicates that concentrations of the organic acid or the oxidizing agent may be varied to adjust a polishing rate for copper while keeping a polishing rate for tantalum constant, i.e., a polishing rate ratio of copper/tantalum may be controlled while keeping a polishing rate for tantalum constant.

Observation of the cross section of the substrate by SEM indicated that dishing and erosion were prevented. Furthermore, observation of the polished surface by SEM indicated that there were no significant scratches.

TABLE 10

|  | Potassium sulfate (wt %) | Hydrogen peroxide (wt %) | Organic acid | Conc. of an organic acid (wt %) | Benzo-triazole (wt %) | Ta polishing rate (nm/min) | Cu polishing rate (nm/min) |
|---|---|---|---|---|---|---|---|
| Example 38 | 1.0 | 2.5 | Oxalic acid | 0.1 | 0.001 | 65.2 | 29.8 |
| Example 39 | 1.0 | 2.5 | Malic acid | 0.02 | 0.005 | 64.0 | 38.1 |
| Example 40 | 1.0 | 2.5 | Malic acid | 0.03 | 0.005 | 64.3 | 65.2 |

TABLE 10-continued

|  | Potassium sulfate (wt %) | Hydrogen peroxide (wt %) | Organic acid | Conc. of an organic acid (wt %) | Benzo-triazole (wt %) | Ta polishing rate (nm/min) | Cu polishing rate (nm/min) |
|---|---|---|---|---|---|---|---|
| Example 41 | 1.0 | 2.5 | Malic acid | 0.04 | 0.005 | 64.7 | 100.5 |

Examples 42 and 43

One-step Polishing Using The Second Slurry

Polishing slurries having the compositions shown in Table 11 were prepared. These polishing slurries were used to conduct CMP in one step as described above, during which polishing rates were determined. The results are shown in Table 11.

These results indicate that a polishing rate for copper was reduced while a polishing rate for the Ta film was kept constant, by partially replacing potassium peroxodisulfate with potassium sulfate. It indicates that an appropriate combination of inorganic salts may permit us to adjust a polishing rate ratio between copper and a Ta film without using an oxidizing agent.

TABLE 11

|  | Potassium sulfate (wt %) | Potassium peroxo-disulfate (wt %) | Hydrogen peroxide (wt %) | Organic acid | Conc. of an organic acid (wt %) | Benzo-triazole (wt %) | Ta polishing rate (nm/min) | Cu polishing rate (nm/min) |
|---|---|---|---|---|---|---|---|---|
| Example 42 | 0 | 0.5 | 0 | Malic acid | 0.15 | 0.005 | 47.5 | 128.3 |
| Example 43 | 0.25 | 0.25 | 0 | Malic acid | 0.15 | 0.005 | 48.1 | 71.2 |

Example 44

The First Polishing Process

In the first polishing step, CMP was conducted using the polishing slurry in Example 18 containing triethanolamine, and polishing was stopped at the time when a copper film corresponding to about 15% of the area of the substrate surface other than the concave remained on the insulating film other than the concave.

As the second polishing step, CMP was conducted using a polishing slurry (slurry No. 20) in Example 21 until the surface of an insulating film other than a concave was completely exposed. As seen in Table 6, a polishing rate ratio for the polishing slurry (Cu/Ta/silicon oxide) was 2.2/1/0.05.

Observation of the cross section of the substrate after polishing by SEM indicated that dishing and erosion were substantially completely prevented. Furthermore, observation of the polished surface by SEM indicated that there were no significant scratches.

What is claimed is:

1. A process for forming a metal interconnect comprising the steps of forming a concave in an insulating film formed on a substrate, forming a barrier metal film on the insulating film, forming an interconnect metal film over the whole surface such that the concave is filled with the metal and then polishing the surface of the substrate by chemical mechanical polishing, characterized in that the polishing step comprises a first polishing step of polishing the surface such that a portion of the interconnect metal film remains on the surface other than the concave, the portion of the interconnect film remaining on the surface not being insubstantial, and a second polishing step of polishing the surface using a polishing slurry controlling a polishing-rate ratio of the interconnect metal to the barrier metal of 1 to 3 inclusive, until the surface of the insulating film other than the concave is substantially completely exposed, wherein in the first polishing step, the polishing slurry comprises a polishing material, an oxidizing agent, an organic acid and an alkanolamine represented by general formula (1):

$$NR^1{}_m(R^2OH)_n \qquad (1)$$

wherein $R^1$ is hydrogen or alkyl having 1 to 5 carbon atoms; $R^2$ is alkylene having 1 to 5 carbon atoms; m is an integer of 0 to 2 inclusive; and n is a natural number of 1 to 3 inclusive, provided that m+n is 3.

2. The process for forming a metal interconnect as claimed in claim 1, wherein the alkanolamine in the polishing slurry used is at least one selected from the group consisting of ethanolamine, diethanolamine and triethanolamine.

3. The process for forming a metal interconnect claimed in claim 1, wherein the barrier metal film is a tantalum-containing metal film and the interconnect metal film is a copper or copper alloy film.

4. The process of claim 1 wherein the second polishing step employs a polishing slurry comprising a silica polishing material and a carboxylic acid represented by general formula (2):

(2)

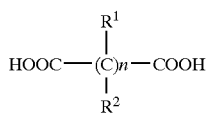

wherein n is 0, 1, 2 or 3 and each of $R^1$ and $R^2$ is, independently for a carbon atom to which it attaches, hydrogen, —OH or —COOH; or general formula (3):

(3)

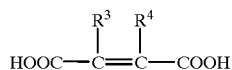

where each of $R^3$ and $R^4$ is independently hydrogen or —OH.

5. The process of claim 1 wherein the polishing slurry employed in the second polishing step is comprised of a silica polishing material and an inorganic salt.

6. The process of claim 4 wherein the carboxylic acid is selected from the group consisting of oxalic acid, malonic acid, tartaric acid, mallic acid, glutaric acid, citric acid and maleic acid.

7. The process of claim 5 wherein the inorganic salt is selected from the group consisting of a hydroacid salt, an oxo acid salt, a peroxo acid salt and a halogen oxo acid salt.

8. A process for forming a metal interconnect comprising the steps of forming a concave in an insulating film formed on a substrate, forming a barrier metal film on the insulating film, forming an interconnect metal film over the whole surface such that the concave is filled with the metal and then polishing the surface of the substrate by chemical mechanical polishing, characterized in that the polishing step comprises a first polishing step of polishing the surface such that a portion of the interconnect metal film remains on the surface other than the concave, the portion of the interconnect film remaining on the surface not being insubstantial, and a second polishing step of polishing the surface using a polishing slurry controlling a polishing-rate ratio of the interconnect metal to the barrier metal of 1 to 3 inclusive, until the surface of the insulating film other than the concave is substantially completely exposed, wherein the polishing slurry used in the second polishing step comprises a silica polishing material and a carboxylic acid represented by general formula (2):

(2)

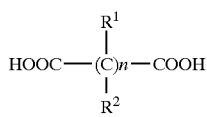

wherein n is 0, 1, 2 or 3 and each of $R^1$ and $R^2$ is, independently for a carbon atom to which it attaches, hydrogen, —OH or —COOH; or general formula (3):

(3)

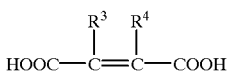

where each of $R^3$ and $R^4$ is independently hydrogen or —OH.

9. The process for forming a metal interconnect as claimed in claim 8, wherein the carboxylic acid in the polishing slurry used is at least one selected from the group consisting of oxalic acid, malonic acid, tartaric acid, malic acid, glutaric acid, citric acid and maleic acid.

10. The process of forming a metal interconnect as claimed in claim 8, wherein the polishing slurry used in the second polishing step controls a polishing rate ratio of the insulating film to the barrier metal of 0.01 to 0.5, inclusive.

11. The process of forming a metal interconnect as claimed in claim 8, wherein the barrier metal film is a tantalum-containing metal film and the interconnect metal film is a copper or copper alloy film.

12. The process of forming a metal interconnect as claimed in claim 8, wherein the polishing slurry used in the second polishing step comprises an oxidizing agent.

13. The process of forming a metal interconnect as claimed in claim 12, wherein the polishing slurry used in the second polishing step comprises benzotriazole or its derivative.

14. A process for forming a metal interconnect comprising the steps of forming a concave in an insulating film formed on a substrate, forming a barrier metal film on the insulating film, forming an interconnect metal film over the whole surface such that the concave is filled with the metal and then polishing the surface of the substrate chemical mechanical polishing, characterized in that the polishing step comprises a first polishing step of polishing the surface using a polishing slurry comprising a polishing material, an oxidizing agent, an organic acid and an alkanolamine represented by the general formula (1):

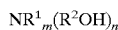 (1)

($R^1$ is hydrogen or alkyl having 1 to 5 carbon atoms; $R^2$ is alkylene having 1 to 5 carbon atoms; m is an integer of 0 to 2 both inclusive; and n is a natural number of 1 to 3 both inclusive, provided that m+n is 3), such that, except for the concave portion, the interconnect metal film is substantially removed from the surface while the barrier metal film is not completely removed by polishing, and a second polishing step of polishing the surface using a polishing slurry controlling a polishing-rate ratio of the interconnect metal to the barrier metal of 1 or less, until the surface of the insulating film other than the concave is substantially completely exposed.

15. The process for forming a metal interconnect as claimed in claim 14, wherein the alkanolamine in the polishing slurry used is at least one selected from the group consisting of ethanolamine, diethanolamine and triethanolamine.

16. The process for forming a metal interconnect as claimed in claim 14, wherein the polishing slurry used in the second polishing step controls a polishing rate ratio of the insulating film to the barrier metal to 0.01 to 0.5 both inclusive.

17. The process for forming a metal interconnect as claimed in claim 14, wherein the barrier metal film is a tantalum-containing metal film and the interconnect metal film is a copper or copper alloy film.

18. The process for forming a metal interconnect as claimed in claim 14, wherein the polishing slurry used in the second polishing step comprises a silica polishing material and a carboxylic acid represented by general formula (2):

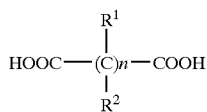

(2)

wherein n is 0, 1, 2 or 3 and each of $R^1$ and $R^2$ is, independently for a carbon atom to which it attaches, hydrogen, —OH or —COOH; or general formula (3):

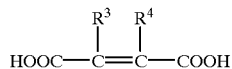

(3)

where each of $R^3$ and $R^4$ is independently hydrogen or —OH.

19. The process for forming a metal interconnect as claimed in claim 14, wherein the polishing slurry used in the second polishing step comprises a silica polishing material and an inorganic salt.

20. The process for forming a metal interconnect as claimed in claim 14, wherein the polishing slurry used in the second polishing step comprises an oxidizing agent.

21. The process for forming a metal interconnect as claimed in claim 18, wherein the carboxylic acid in the polishing slurry used is at least one selected from the group consisting of oxalic acid, malonic acid, tartaric acid, malic acid, glutaric acid, citric acid maleic acid.

22. The process for forming a metal interconnect as claimed in claim 19, wherein the inorganic salt in the polishing slurry used in polishing is at least one selected from the group consisting of a hydroacid salt, an oxo acid salt, a peroxo acid salt and a halogen oxo acid salt.

23. The process for forming a metal interconnect as claimed in claim 20, wherein the polishing slurry used in the second polishing step comprises benzotriazole or its derivative.

* * * * *